United States Patent
Li et al.

(10) Patent No.: US 11,540,412 B1
(45) Date of Patent: Dec. 27, 2022

(54) SAFETY DEVICE OF MEDIUM-HIGH VOLTAGE SYSTEM WITH POWER MODULE

(71) Applicant: Delta Electronics, Inc., Taoyuan (TW)

(72) Inventors: Sheng-Hua Li, Taoyuan (TW); Chun-Han Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/492,447

(22) Filed: Oct. 1, 2021

(30) Foreign Application Priority Data

Aug. 4, 2021 (CN) .......................... 202110889212.X

(51) Int. Cl.
*H05K 7/14* (2006.01)
*H05K 5/03* (2006.01)
*H05K 5/02* (2006.01)

(52) U.S. Cl.
CPC ......... *H05K 7/1438* (2013.01); *H05K 5/0221* (2013.01); *H05K 5/03* (2013.01)

(58) Field of Classification Search
CPC ....................................................... G06F 1/181
See application file for complete search history.

(56) References Cited

U.S. PATENT DOCUMENTS

| 7,724,505 B2 * | 5/2010 | Chigasaki .............. H04B 1/082 361/679.01 |
| 2011/0113691 A1 * | 5/2011 | Chang ..................... G06F 1/181 49/109 |
| 2020/0296855 A1 | 9/2020 | Huang et al. |

FOREIGN PATENT DOCUMENTS

| CN | 2697914 Y | 5/2005 |
| CN | 110289750 A | 9/2019 |
| CN | 211017829 U | 7/2020 |
| TW | 572262 U | 1/2004 |
| TW | 201540158 A | 10/2015 |
| TW | I687011 B | 3/2020 |

* cited by examiner

*Primary Examiner* — Jerry Wu
(74) *Attorney, Agent, or Firm* — Kirton McConkie; Evan R. Witt

(57) ABSTRACT

A safety device for medium-high voltage system is disclosed and includes a cabinet, a power module and a metal cover plate. The cabinet includes an accommodation seat connected to the medium-voltage charged region and having an opening. The power module is detachably disposed in the accommodation seat through the opening. The metal cover plate is pivotally connected to the accommodation seat and grounded. When the metal cover plate is in the first position, the opening is closed and the medium-voltage charged region is shielded. When the power module is set in the accommodation seat, the metal cover plate is pivotally rotated to a second position, and the power module is electrically connected to the medium-voltage charged region. When the power module is detached from the accommodation seat, the metal cover plate is rotated to the first position, and the opening is closed to shield the medium-voltage charged region.

19 Claims, 15 Drawing Sheets

SAFETY DEVICE OF MEDIUM-HIGH VOLTAGE SYSTEM WITH POWER MODULE

FIELD OF THE INVENTION

The present disclosure relates to a safety device, and more particularly to a safety device of a medium-high voltage system with a power module for simplifying the maintenance procedures of the power module in the medium-high voltage system and ensuring the safety, whereby the user is capable of maintaining the power module without powering off the medium-high voltage system.

BACKGROUND OF THE INVENTION

With the development of the economy, the demand for electricity has increased sharply. In addition, the safety and protection requirements for electricity use are becoming more and more stringent. In a conventional cabinet of medium-high voltage system, a plurality of power modules are disposed therein for users to use. However, for the maintenance of the power module in the cabinet of the medium-high voltage system, a grounded metal has to be set in accordance with the requirements of current safety regulations to provide safety shielding between the charged body of the medium-high voltage system and the maintenance personnel. When the power module in the medium-high voltage system has to be maintained, the medium-high voltage system must be powered off, and then the power module is taken out for maintenance. Therefore, there are many inconveniences in the maintenance procedures of the power module in the conventional medium-high voltage system. Especially, in the industrial park, the medium-high voltage system supplies power to a lot of users. Since there are a large number of users, if the medium-high voltage system needs to be powered off for maintenance, it affects the normal production of electricity-using companies and causes significant losses.

On the other hand, the conventional power-off mechanism used in the conventional safety device of medium-high voltage system with the power supply is expensive. Moreover, the maintenance procedures of the power module are limited by the power-off mechanism of the medium-high voltage system. It fails to improve the performance and the quality of the maintenance procedures.

Therefore, there is a need of providing a safety device of a medium-high voltage system with a power module to obviate the drawbacks encountered by the prior arts, simplify the maintenance procedures of the power module in the medium-high voltage system and ensure the safety, so that the user is capable of maintaining the power module without powering off the medium-high voltage system.

SUMMARY OF THE INVENTION

An object of the present disclosure is to provide a safety device of a medium-high voltage system with a power module for simplifying the maintenance procedures of the power module in the medium-high voltage system and ensuring the safety, whereby the user is capable of maintaining the power module without powering off the medium-high voltage system. Thus, the performance and the quality of the maintenance procedures are improved effectively.

Another object of the present disclosure is to provide a safety device of a medium-high voltage system with a power module. A metal cover plate is pivotally connected to the system cabinet and grounded, so as to replace the role of the outer case in the system cabinet. When the power module is plugged in and pulled out, the grounded metal cover plate is operated correspondingly, so as to be served as a safety shielding between the maintenance personnel and the medium-high voltage charged body. Whereby, the maintenance procedures of the power module in medium-high voltage systems are simplified. When the power module is pulled out of the system cabinet of the medium-high voltage system, the medium-high voltage charged region is isolated from the maintenance personnel by the grounded metal cover plate automatically, so as to ensure the safety.

A further object of the present disclosure is to provide a safety device of a medium-high voltage system with a power module. The metal cover plate rotated between a first position and a second position is further cooperated with at least two elastic latches. When the power module is detached, the metal cover plate is limited at the first position by the at least two elastic latches, so as to prevent the metal cover plate from being rotated or prevent the opening from being opened by accidental touch of human. Furthermore, when the power module is placed in the accommodation seat, the at least two elastic latches are engaged with the power module to prevent the power module from being detached and separated. On the other hand, for detaching the power module, the at least two elastic latches have to be forced synchronously, to release the power module, so that the power module is allowed to be detached from the accommodation seat. Thus, the maintenance safety of the power module is further ensured, and the competitiveness of the product is enhanced effectively.

In accordance with an aspect of the present disclosure, a safety device of a medium-high voltage system is provided and includes a cabinet, a power module and a metal cover plate. The cabinet includes an accommodation seat. The accommodation seat forms an accommodation space and is connected to a medium-voltage charged region, and the accommodation seat has an opening. The power module is spatially corresponding to the accommodation seat. The power module is allowed to pass through the opening and detachably disposed in the accommodation seat, so as to be electrically connected to the medium-voltage charged region. The metal cover plate is pivotally connected to an upper edge of the accommodation seat and grounded. When the metal cover plate is in a first position, the opening is closed and the medium-voltage charged region is shield. The power module is allowed to pass through the opening to push the metal cover plate, so that the metal cover plate is pivotally rotated to a second position and abutted against a top surface of the power module. When the power module is placed into the accommodation space and set in the accommodation seat, the power module is in an electrical connection with the medium-voltage charged region. When the power module is detached from the accommodation seat, the metal cover plate is rotated to the first position, so that the opening is closed to shield the medium-voltage charged region.

In an embodiment, the safety device of the medium-high voltage system further includes at least two elastic latches spatially corresponding to the metal cover plate, disposed adjacent to the opening, and configured to limit the metal cover plate at the first position thereby.

In an embodiment, the at least two elastic latches are arranged along a lateral edge of the opening and spatially corresponding to a lateral side of the metal cover plate, disposed adjacent to the opening, and configured to limit the metal cover plate at the first position thereby.

In an embodiment, the at least two elastic latches are disposed separately from each other.

In an embodiment, each of the elastic latches includes a hook and an elastic element, and the elastic element constantly abuts against the hook, so that the hook is protruded toward the accommodation seat, wherein when the metal cover plate is rotated to the first position, the hook prevents the metal cover plate from rotating to the second position.

In an embodiment, each of the elastic latches further includes an operation portion connected to the hook and the elastic element, and constantly pressed by the elastic element to protrude toward the opening, wherein when the operation portion is forced to drive the hook to abut against the elastic element, the hook is separated away from a path of the metal cover plate rotating from the first position to the second position.

In an embodiment, when the power module is placed into the accommodation space through the opening and set in the accommodation seat, the operation portions of the at least two elastic latches are driven by the power module, and the hooks of the at least two elastic latches are separated away from the path of the metal cover plate rotating from the first position to the second position, so that the power module pushes against the metal cover plate to rotate to the second position.

In an embodiment, after the power module is placed into the accommodation space through the opening and set in the accommodation seat, the operation portions of the at least two elastic latches are engaged with a front end of the power module to prevent the power module from being detached from accommodation seat.

In an embodiment, when the operation portions of the at least two elastic latches are forced simultaneously to move away from the opening and the at least two elastic latches are disengaged with the front end of the power module, the power module is allowed to be detached from the accommodation seat through the opening.

In an embodiment, the accommodation seat includes a first connection element disposed between the accommodation seat and the medium-voltage charged region, and the power module includes a second connection element disposed at a rear end of the power module, wherein when the power module is placed into the accommodation space and set in the accommodation seat, the first connection element is engaged with the second connection element, and the power module and the medium-voltage charged region are electrically connected to each other.

In an embodiment, the power module includes a handle disposed at a front end of the power module, wherein when the power module is placed into the accommodation space and set in the accommodation seat, the handle is exposed to the opening.

In an embodiment, when the handle is forced to detach the power module from the accommodation seat, the first connection element is separated from the second connection element, and an electrical connection between the power module and the medium-voltage charged region is disconnected.

In an embodiment, the first connection element and the second connection element are a male connector and a female connector, respectively, wherein the first connection element is disposed on a circuit board and protruded from an outer edge of the circuit board, wherein when the rear end of the power module is attached to the outer edge of the circuit board, the first connection element and the second connection element are engaged with each other to form an electrical connection.

In an embodiment, the cabinet includes at least one fixing hole disposed adjacent to the opening of the accommodation seat, wherein the power module includes at least one fixed portion spatially corresponding to the at least one fixing hole, wherein after the power module is placed into the accommodation space through the opening and set in the accommodation seat, the at least one fixed portion and the at least one fixing hole are engaged with each other through a fastening element, and the power module is fastened in the cabinet.

In an embodiment, the at least one fixed portion includes two fixed portions disposed at two diagonally opposite corners of the front end of the power module, respectively, and the fastening element is a screw.

In an embodiment, the metal cover plate is pivotally connected to the upper edge of the accommodation seat through a pivoting element.

In an embodiment, the pivoting element is a hinge.

In an embodiment, the power module further includes an insulation section disposed between a front end of the power module and a rear end of the power module.

In an embodiment, the cabinet is grounded, the medium-voltage charged region is accommodated within the cabinet, and the medium-voltage charged region is insulated from the cabinet.

In an embodiment, the safety device of the medium-high voltage system further includes a control module disposed in the cabinet, electrically connected to the medium-voltage charged region and the power module, and configured to form a solid-state transformer.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
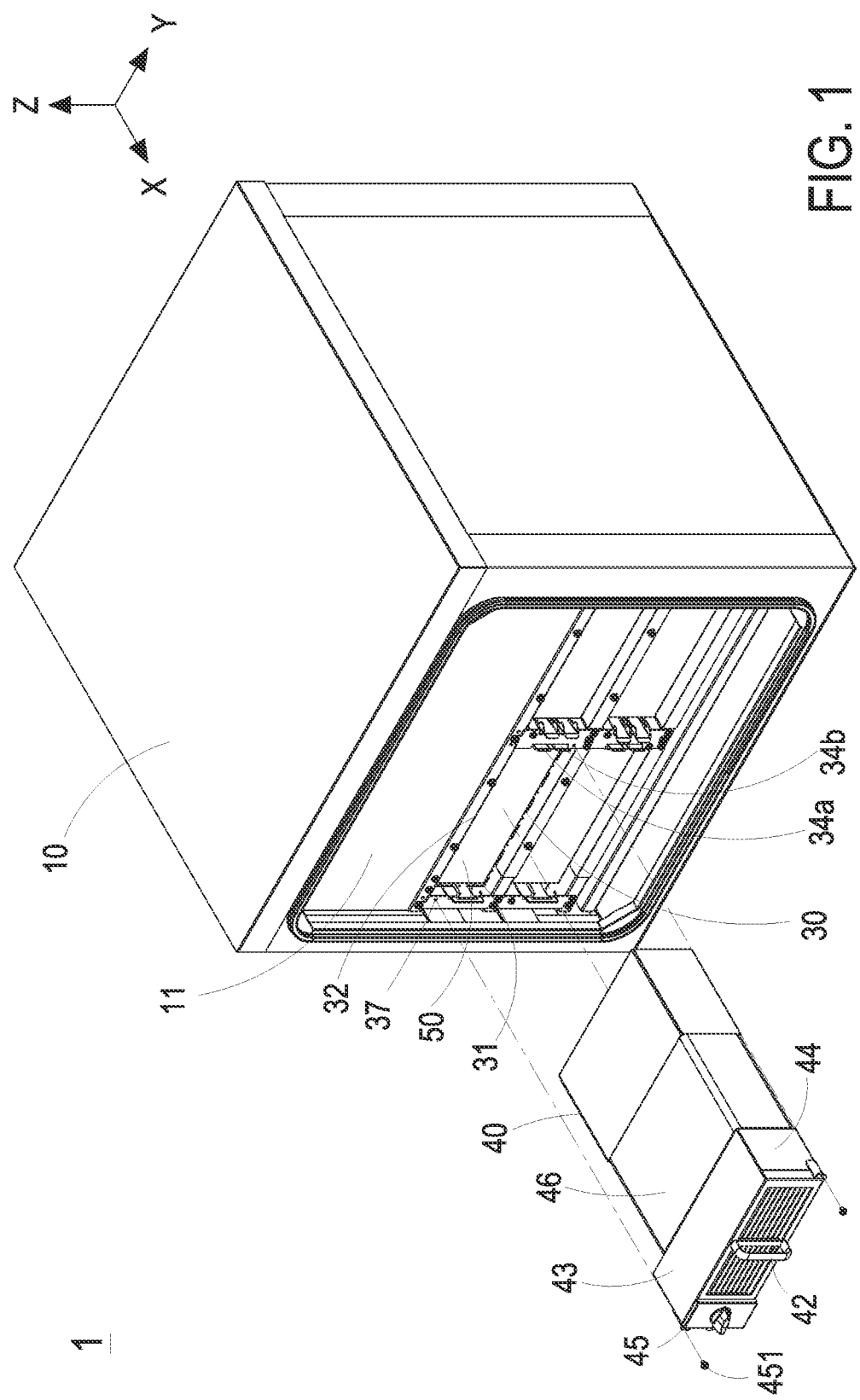
FIG. 1 is a schematic structural view illustrating a safety device of a medium-high voltage system with a separated power module according to an embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
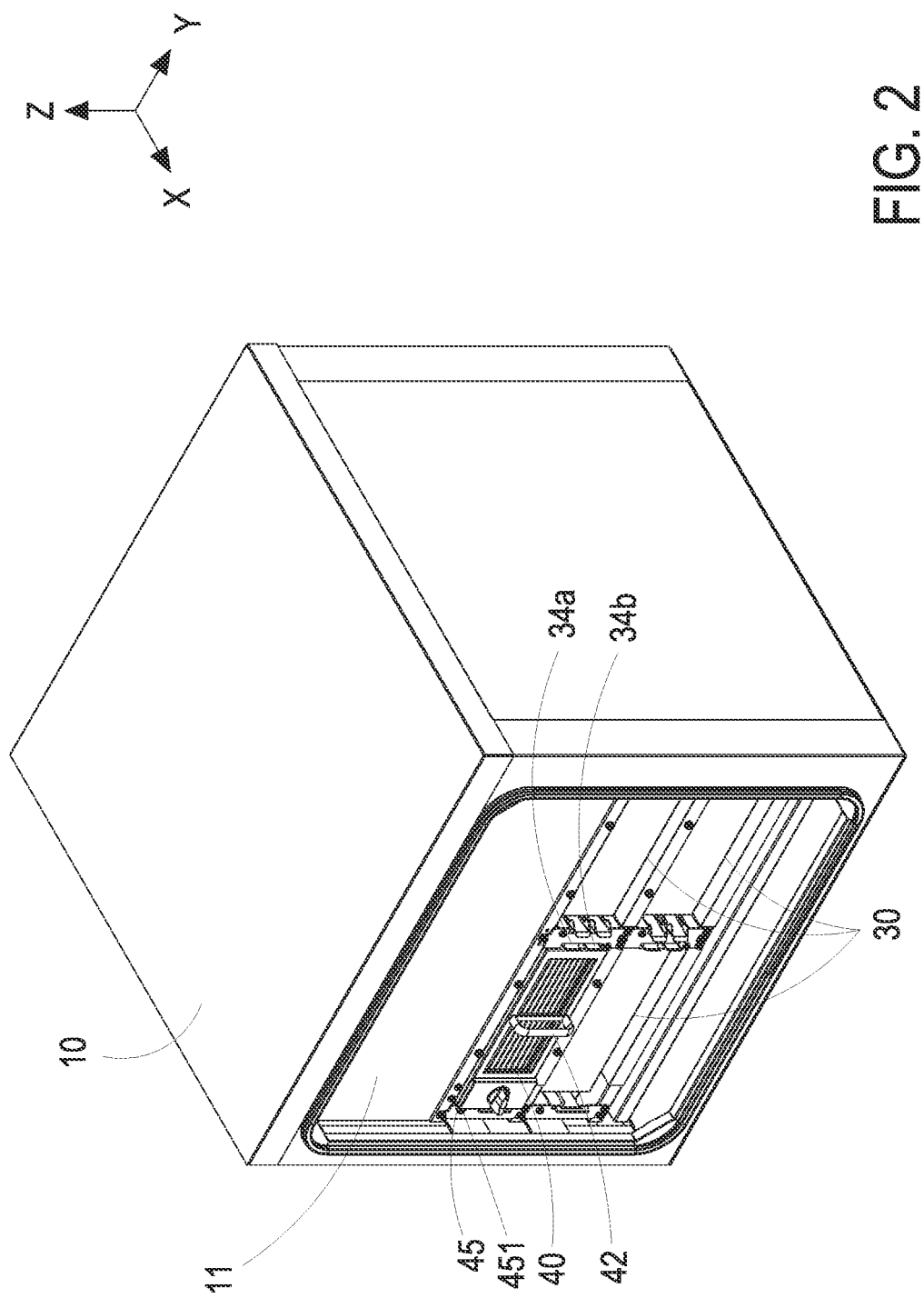
FIG. 2 is a schematic structural view illustrating the safety device of the medium-high voltage system with the power module accommodated therein according to the embodiment of the present disclosure.
Figure 3:
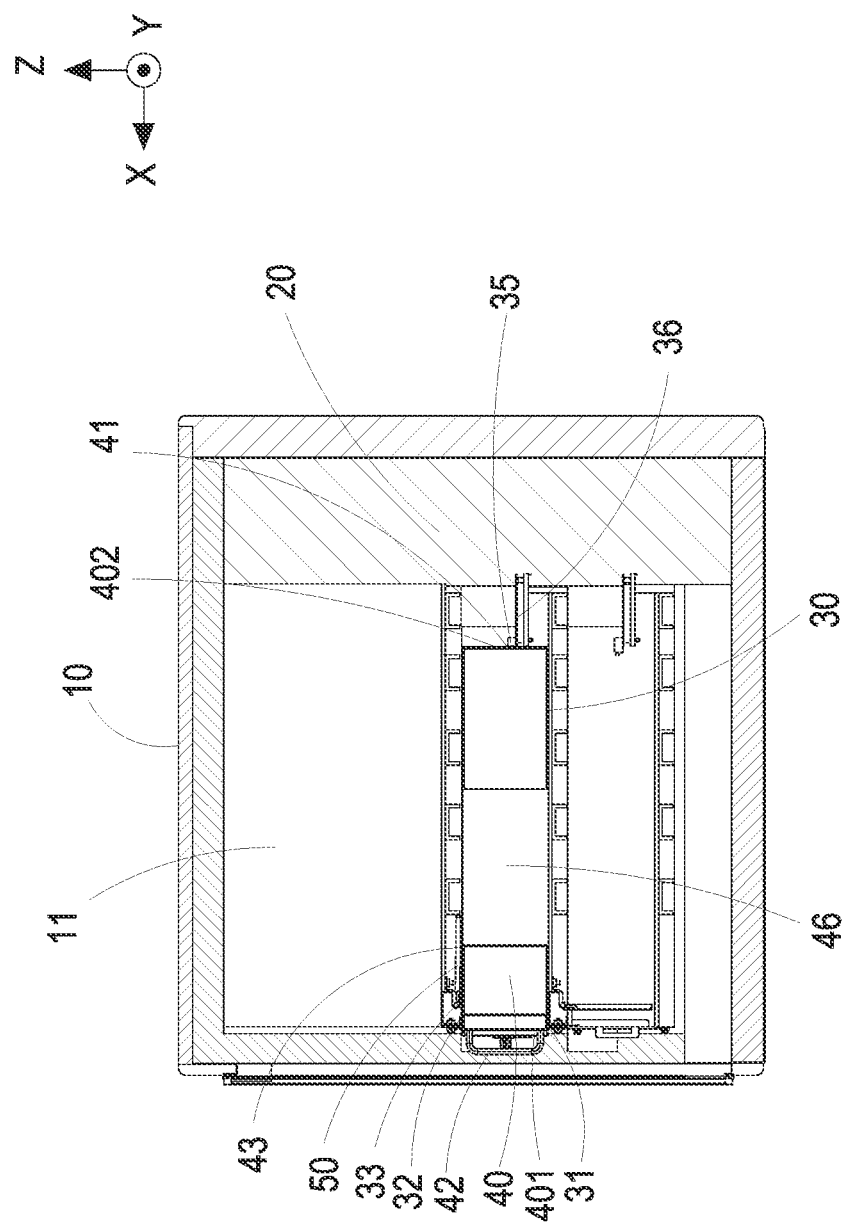
FIG. 3 is a schematic cross-sectional view illustrating the safety device of the medium-high voltage system with the power module according to the embodiment of the present disclosure.

FIG. 1 is a schematic structural view illustrating a safety device of a medium-high voltage system with a separated power module according to an embodiment of the present disclosure. FIG. 2 is a schematic structural view illustrating the safety device of the medium-high voltage system with the power module accommodated therein according to the embodiment of the present disclosure. FIG. 3 is a schematic cross-sectional view illustrating the safety device of the medium-high voltage system with the power module according to the embodiment of the present disclosure. Preferably but not exclusively, in the embodiment, the safety device of the medium-high voltage system (Hereinafter referred to as the safety device) 1 is applied to the field of solid state transformer (SST) for simplifying the maintenance procedures and ensuring the safety, whereby the user is capable of performing the maintenance procedures without powering off the medium-high voltage system. Certainly, the present disclosure is not limited thereto. In the embodiment, the safety device 1 includes a cabinet 10, a power module 40 and a metal cover plate 50. The cabinet 10 includes at least one accommodation seat 30. Each accommodation seat 30 forms an accommodation space 300 and is connected to a medium-voltage charged region 20 accommodated within the cabinet 10. In the embodiment, the cabinet 10 includes four accommodation seats 30. However, the number of the accommodation seats 30 is illustrative merely, and the present disclosure is not limited thereto. In the embodiment, each accommodation seat 30 has an opening 31. The power module 40 is spatially corresponding to the accommodation seat 30. The power module 40 is allowed to pass through the opening 31 and detachably disposed in the accommodation seat 30, so that the power module 40 is electrically connected to the medium-voltage charged region 20. Notably, the power module 40 is selectively paired to one of the four accommodating seats 30. For the convenience of explanation, in the following embodiment, only a single power module 40 paired to a corresponding accommodation seat 30 is taken as an example, but the present disclosure is not limited thereto. In the embodiment, the metal cover plate 50 is pivotally connected to an upper edge 32 of the accommodation seat 30 through a pivoting element 33, and grounded. Preferably but not exclusively, the pivoting element 33 is a hinge. When the metal cover plate 50 is in a first position, the metal cover plate 50 and the opening 31 are aligned with each other, the opening 31 is closed, and the medium-voltage charged region 20 is shield thereby. In the embodiment, the power module 40 is allowed to pass through the opening 31 of the accommodation set 30 to push the metal cover plate 50, so that the metal cover plate 50 is pivotally rotated to a second position and abutted against a top surface 43 of the power module 40. When the power module 40 is placed into the accommodation space 300 and set in the accommodation seat 30, the power module 40 is in an electrical connection with the medium-voltage charged region 20. In addition, when the power module 40 is detached from the accommodation seat 30, the metal cover plate 50 is not pushed by the power module 40, and the metal cover plate 50 is rotated to the first position, so that the opening 31 is closed by the metal cover plate 50 to shield the medium-voltage charged region 20. Thus, the medium-voltage charged region 20 is not exposed through the opening 31.

In the embodiment, the safety device 1 further includes at least two elastic latches 34a, 34b spatially corresponding to the metal cover plate 50, disposed adjacent to the opening 31, and configured to limit the metal cover plate 50 at the first position thereby. In the embodiment, the at least two elastic latches 34a, 34b are disposed separately from each other, to prevent the metal cover plate 50 from being rotated or prevent the opening 31 from being opened by accidental touch of human. In the embodiment, when the power module 40 is placed into the accommodation space 300 and set in the accommodation seat 30, the at least two elastic latches 34a, 34b are engaged with the power module 40 to prevent the power module 40 from being detached and separated. On the other hand, if the user would like to detach the power module 40, the user has to force the at least two elastic latches 34a, 34b synchronously, to release the power module 40, so that the power module 40 is allowed to be detached from the accommodation seat 30. Thus, the maintenance safety of the power module 40 in the safety device 1 is further ensured, and the competitiveness of the product is enhanced effectively.

In the embodiment, the accommodation seat 30 includes a first connection element 35 disposed between the accommodation seat 30 and the medium-voltage charged region 20. The power module 40 includes a second connection element 41 disposed at a rear end 402 of the power module 40. When the power module 40 is placed into the accommodation space 300 and set in the accommodation seat 30, the first connection element 35 is engaged with the second connection element 41, and the power module 40 and the medium-voltage charged region 20 are electrically connected to each other. Moreover, in the embodiment, the power module 40 further includes a handle 42 disposed at a front end 401 of the power module 40. When the power module 40 is placed into the accommodation space 300 and set in the accommodation seat 30, the handle 42 is exposed to the opening 31. When the handle 42 is forced to detach the power module 40 from the accommodation seat 30, the first connection element 35 is separated from the second connection element 41, and an electrical connection between the power module 40 and the medium-voltage charged region 20 is disconnected. Preferably but not exclusively, the first connection element 35 and the second connection element 41 are a male connector and a female connector, respectively. In the embodiment, the first connection element 35 is disposed on a circuit board 36 and protruded from an outer edge of the circuit board 36. When the rear end 402 of the power module 40 is attached to the outer edge of the circuit board 36, the first connection element 35 of the accommodation set 30 and the second connection element 41 of the power module 40 are engaged with each other to form an electrical connection.

In the embodiment, the power module 40 further includes an insulation section 46 disposed between the front end 401 of the power module 40 and the rear end 402 of the power module 40. In addition, the cabinet 10 is grounded, the medium-voltage charged region 20 is accommodated within the cabinet 10, and the medium-voltage charged region 20 is insulated from the cabinet 10. In the embodiment, the safety device 1 further includes a control module 11 disposed in the cabinet 10, electrically connected to the medium-voltage charged region 20 and the power module 40, and configured to form a solid-state transformer (SST). Certainly, the present disclosure is not limited thereto.

In the embodiment, the cabinet 10 includes at least one fixing hole 37 disposed adjacent to the opening 31 of the accommodation seat 30. In addition, the power module 40 includes at least one fixed portion 45 spatially corresponding to the at least one fixing hole 37. In the embodiment, after the power module 40 is placed into the accommodation space 300 through the opening 31 and set in the accommodation seat 30, the at least one fixed portion 45 and the at least one fixing hole 37 are engaged with each other through a fastening element 451, so that the power module 40 is fastened in the cabinet 10. Preferably but not exclusively, in the embodiment, the at least one fixed portion 45 includes two fixed portions 45 disposed at two diagonally opposite corners of the front end 401 of the power module 40, respectively, and the fastening element 451 is a screw. Certainly, the method of fastening the power module 40 in the cabinet 10 is adjustable according to the practical requirements, and the present disclosure is not limited thereto. The operation procedures of the safety device 1 will be further described later.

Figure 4:
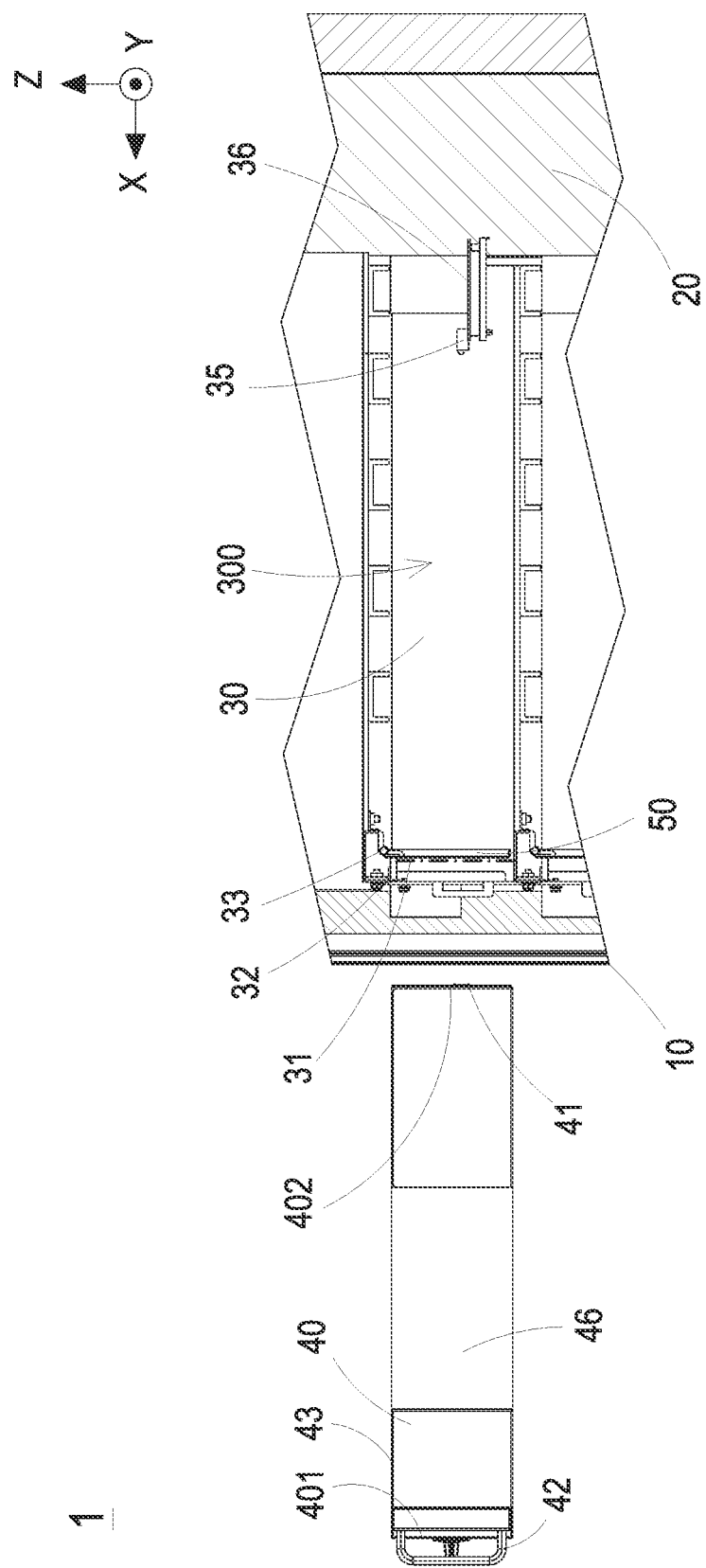
FIG. 4 is a schematic cross-sectional view illustrating the safety device of the medium-high voltage system with the power module detached from the accommodation seat according to the embodiment of the present disclosure.
Figure 5:
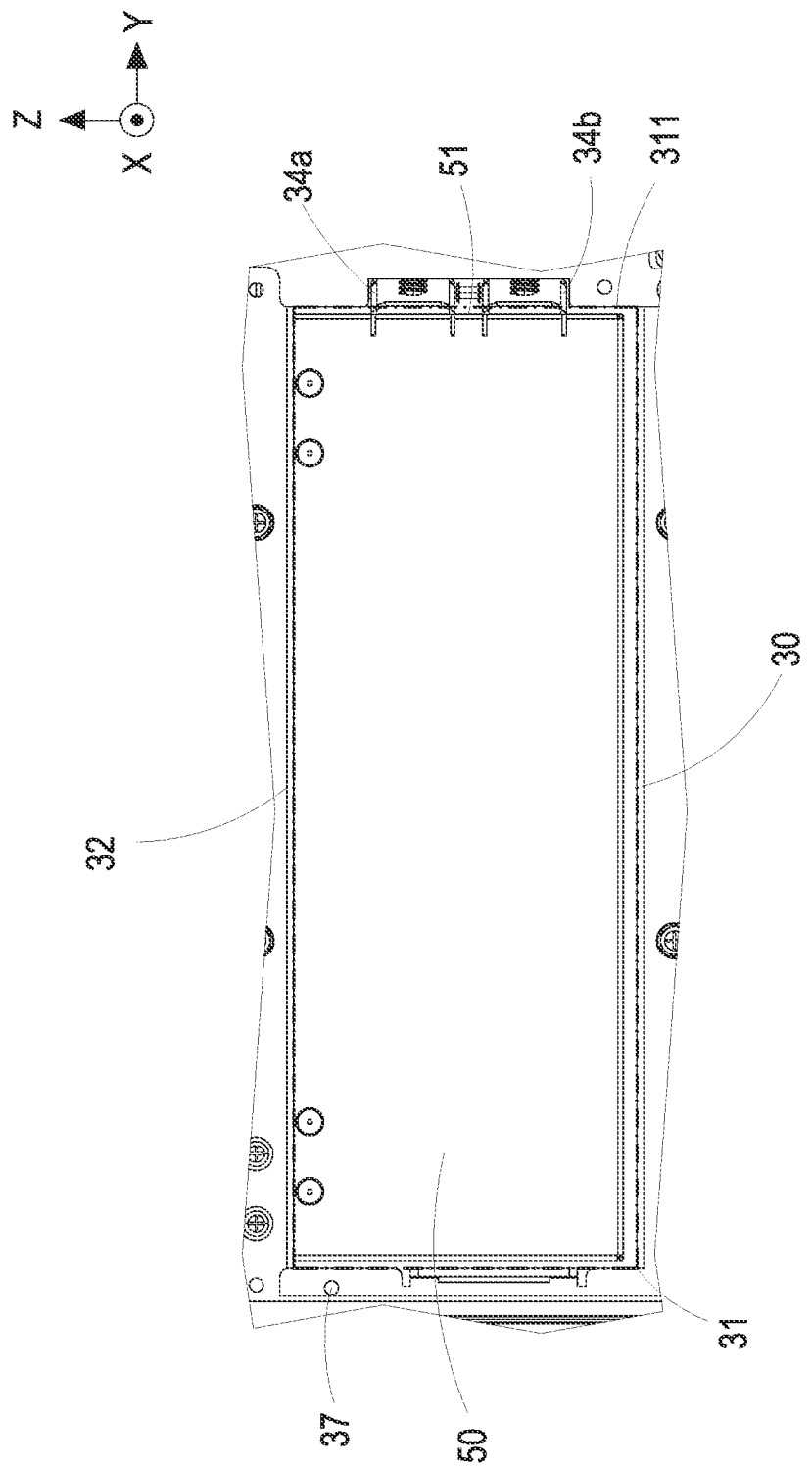
FIG. 5 is a front view illustrating the accommodation seat when the power module is detached from the accommodation seat as shown in FIG. 4.
Figure 6:
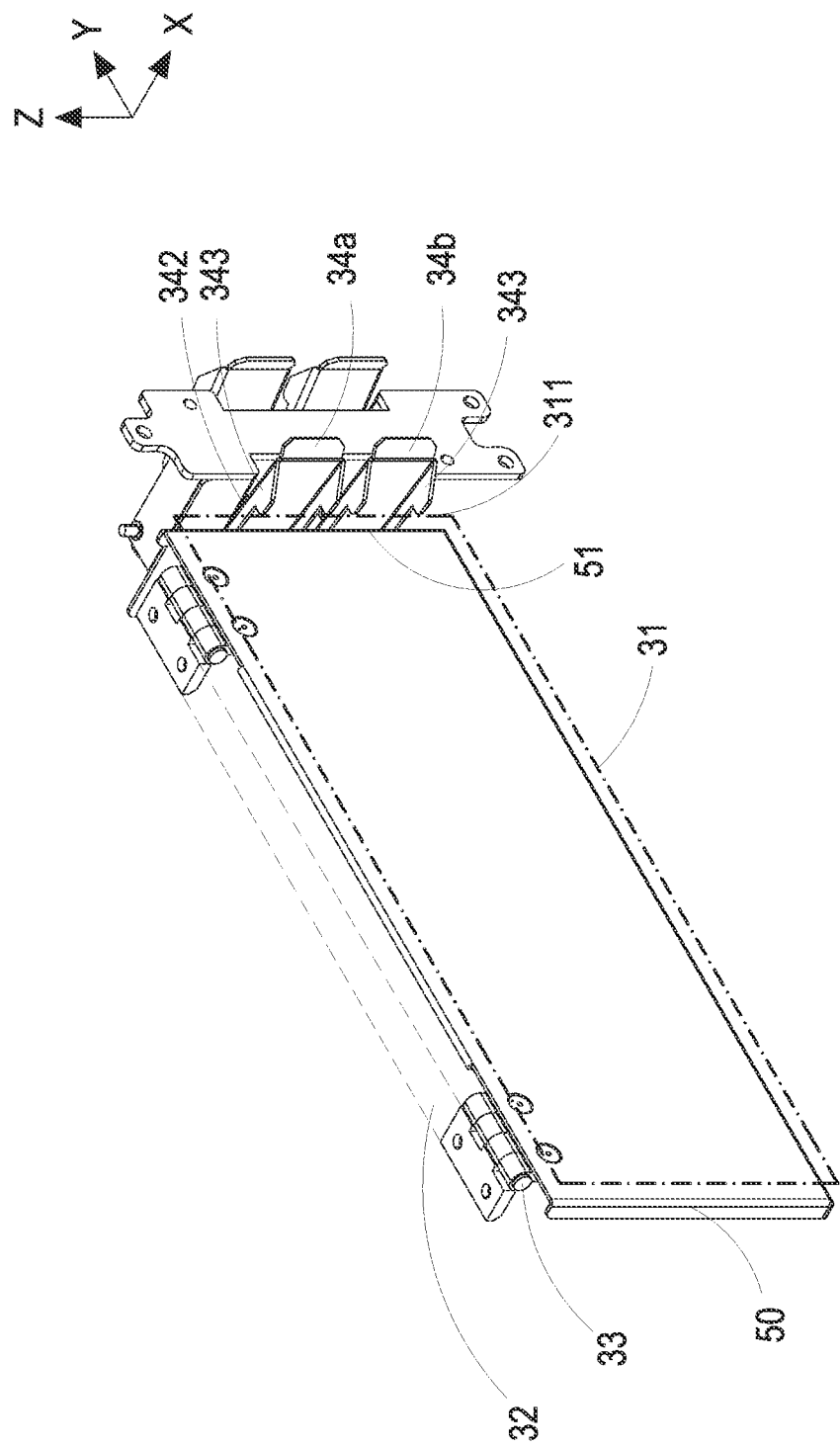
FIG. 6 is a schematic structural view illustrating the metal cover plate in the first position when the power module is detached from the accommodation seat as shown in FIG. 4.
Figure 7:
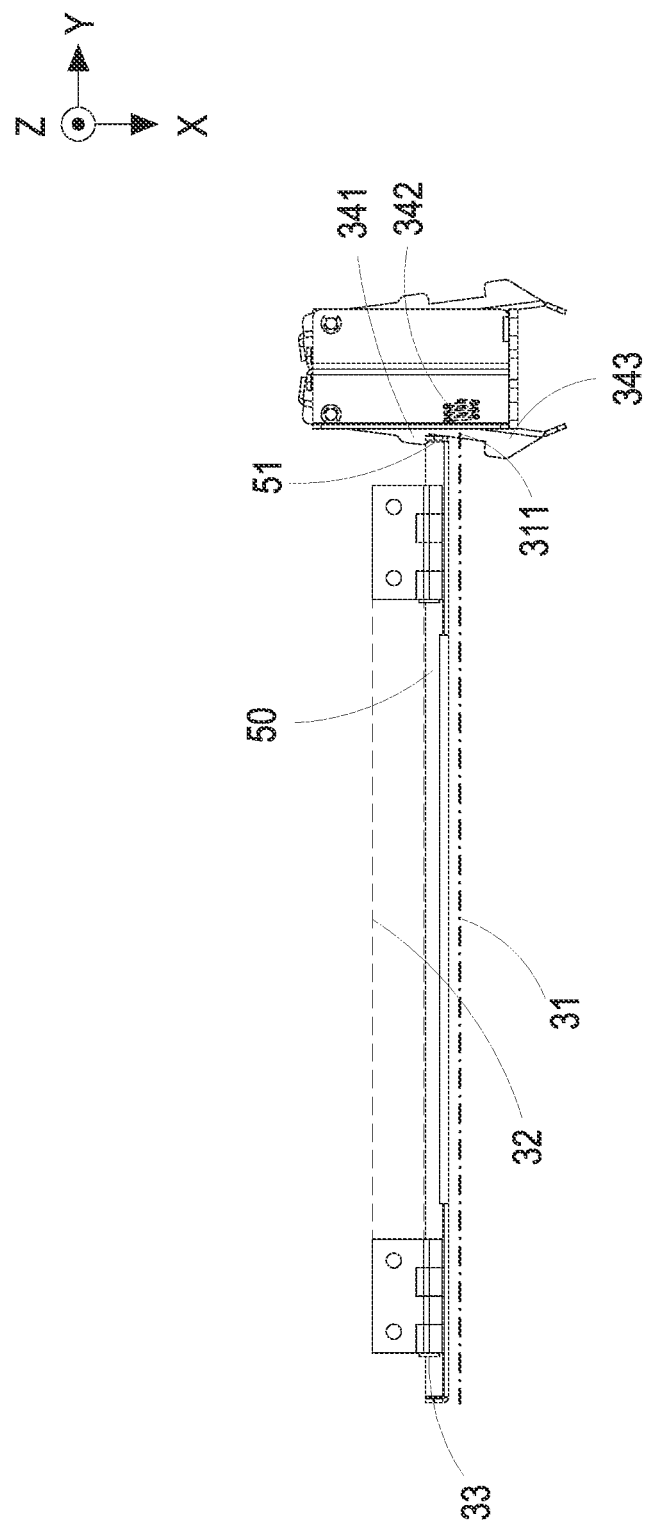
FIG. 7 is a top view of FIG. 6.

FIG. 4 is a schematic cross-sectional view illustrating the safety device of the medium-high voltage system with the power module detached from the accommodation seat according to the embodiment of the present disclosure. FIG. 5 is a front view illustrating the accommodation seat when the power module is detached from the accommodation seat as shown in FIG. 4. FIG. 6 is a schematic structural view illustrating the metal cover plate in the first position when the power module is detached from the accommodation seat as shown in FIG. 4. FIG. 7 is a top view of FIG. 6.

Figure 8:
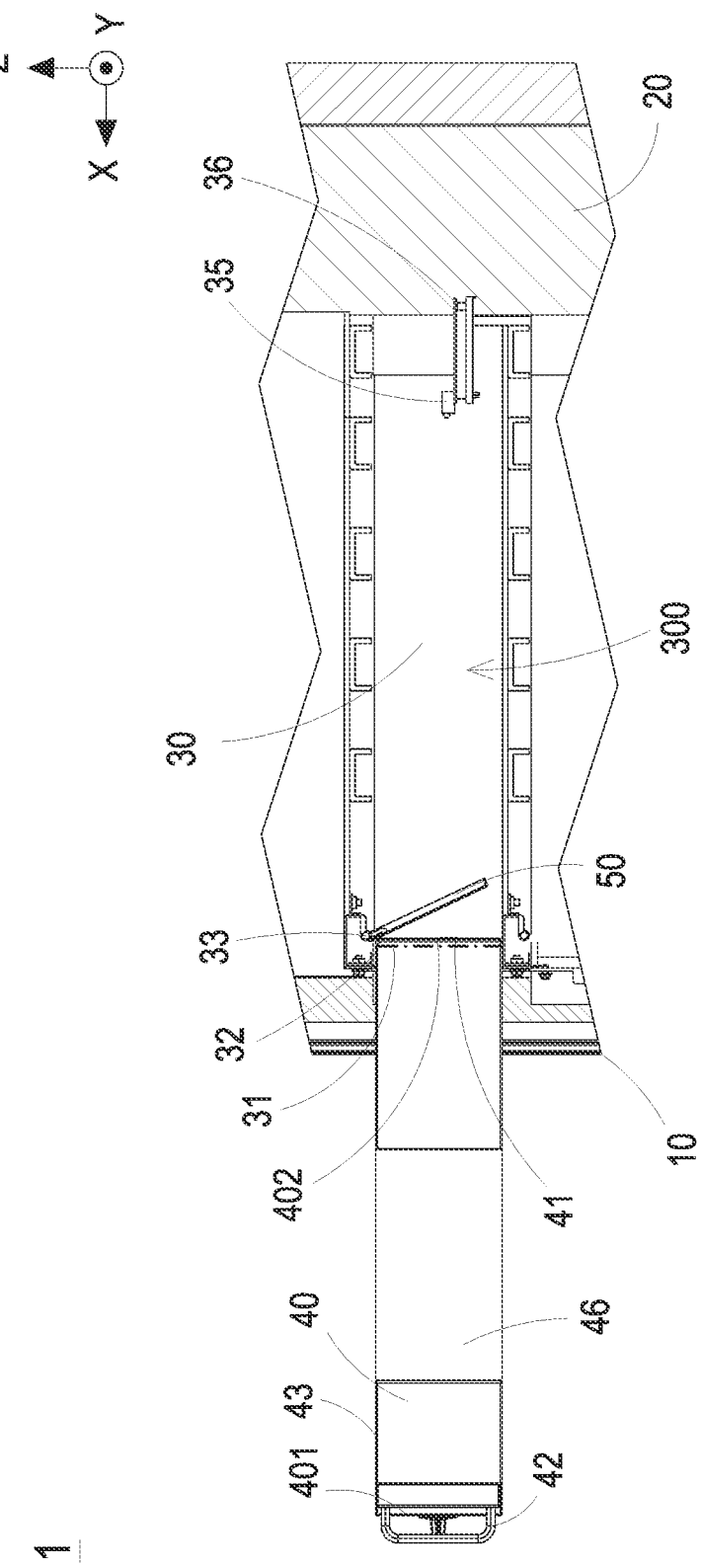
FIG. 8 is a schematic cross-sectional view illustrating the safety device of the medium-high voltage system with the power module moved relative to the accommodation seat according to the embodiment of the present disclosure.
Figure 9:
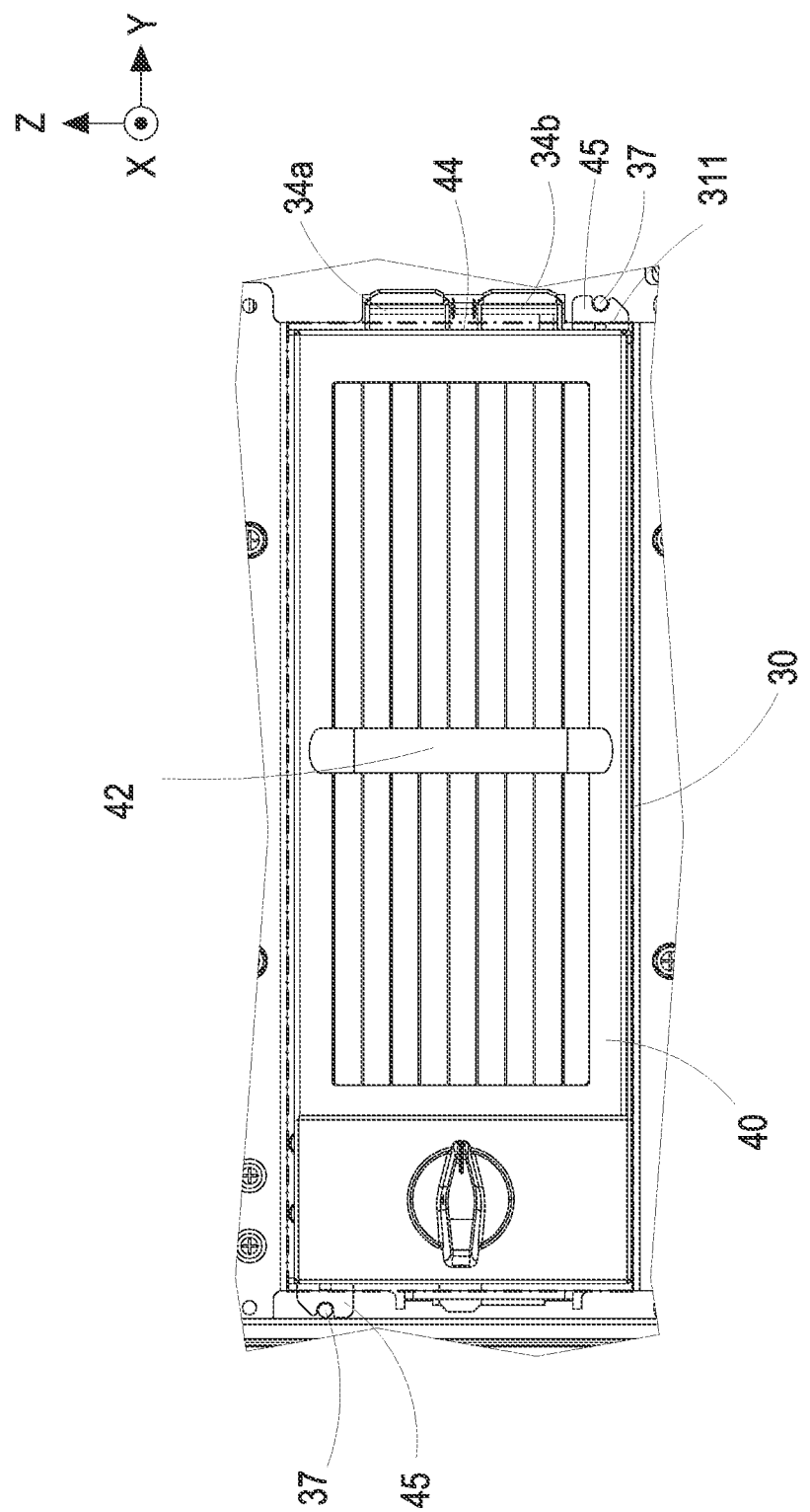
FIG. 9 is a front view illustrating the power module and the accommodation seat when the power module is moved relative to the accommodation seat as shown in FIG. 8.
Figure 10:
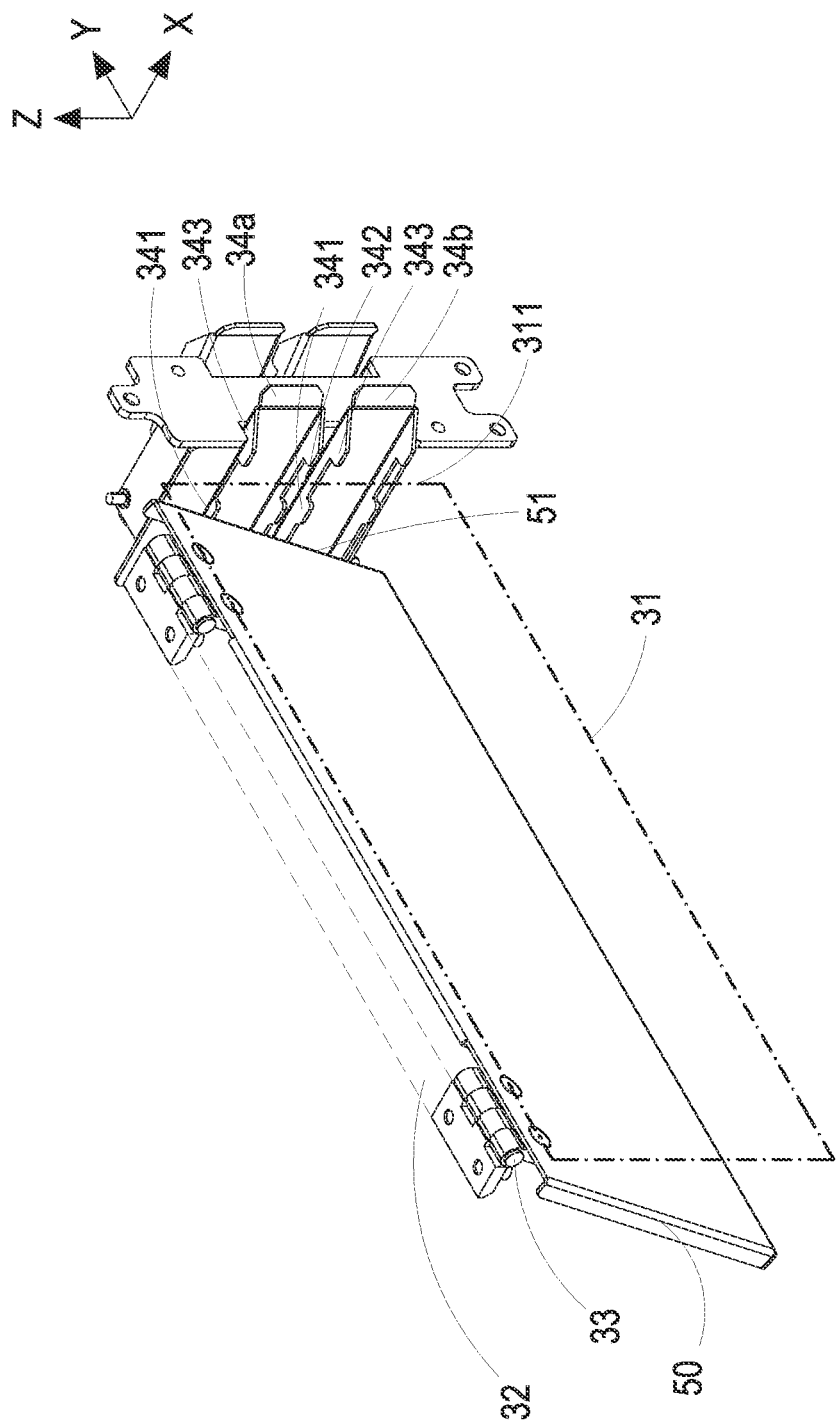
FIG. 10 is a schematic structural view illustrating the metal cover plate rotated from the first position to the second position when the power module is moved relative to the accommodation seat as shown in FIG. 8.
Figure 11:
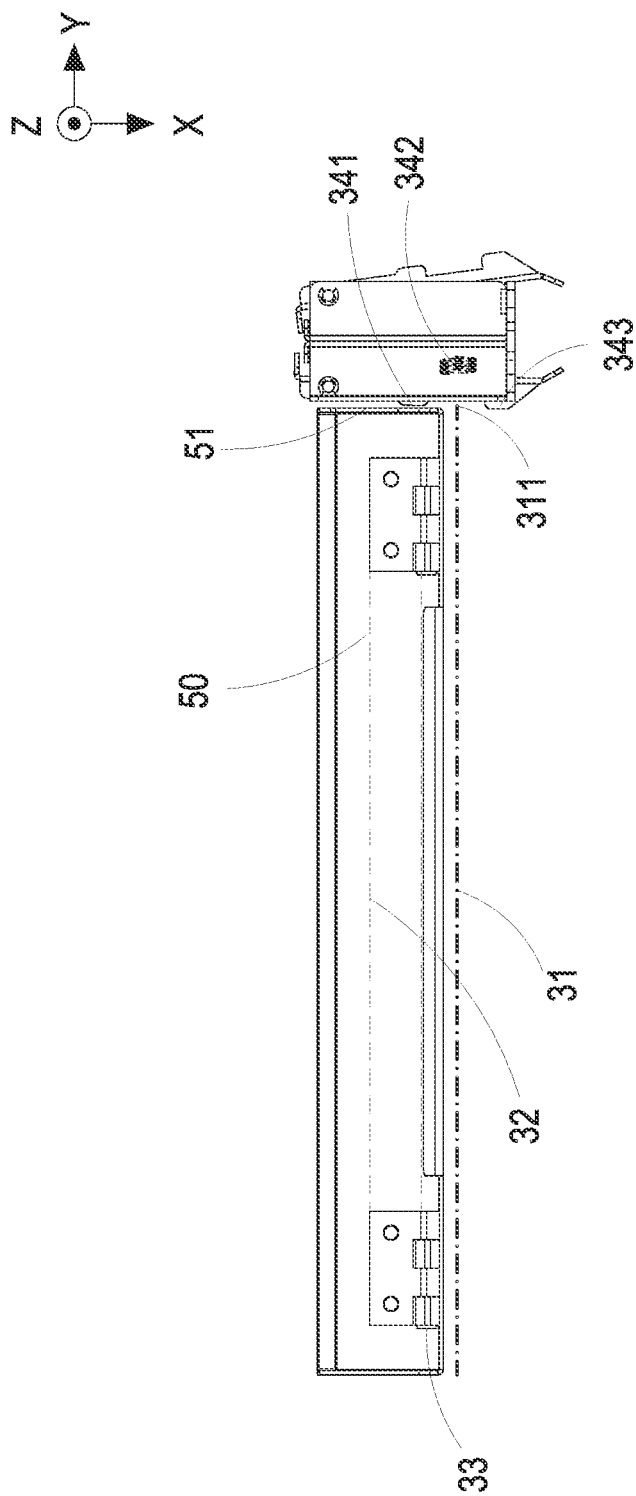
FIG. 11 is a top view of FIG. 10.

In the embodiment, the at least two elastic latches 34a, 34b are arranged along a lateral edge 311 of the opening 31 and spatially corresponding to a lateral side 51 of the metal cover plate 50. Notably, the at least two elastic latches 34a, 34b are disposed separately from each other. Each of the elastic latches 34a, 34b includes a hook 341 and an elastic element 342. Preferably but not exclusively, the elastic element 342 is a spring and constantly abuts against the hook 341, so that the hook 341 is protruded toward the accommodation seat 30. When the power module 40 of the safety device 1 is detached from the accommodation seat 30, the metal cover plate 50 is maintained at the first position, as shown in FIG. 6 and FIG. 7, the hook 341 prevents the metal cover plate 50 from rotating to the second position. Moreover, in the embodiment, each of the elastic latches 34a, 34b further includes an operation portion 343 connected to the hook 341 and the elastic element 342, and constantly pressed by the elastic element 342 to protrude toward the opening 31. When the power module 40 of the safety device 1 is detached from the accommodation seat 30, the hook 341 prevents the metal cover plate 50 from rotating to the second position. If the restriction of the hook 341 on the metal cover plate 50 would like to be released, the operation portions 343 of the two elastic latches 34a, 34b has to be forced to drive the hook 341 to abut against the elastic element 342, so that the hook 341 is separated away from a path of the metal cover plate 50 rotating from the first position to the second position FIG. 8 is a schematic cross-sectional view illustrating the safety device of the medium-high voltage system with the power module moved relative to the accommodation seat according to the embodiment of the present disclosure. FIG. 9 is a front view illustrating the power module and the accommodation seat when the power module is moved relative to the accommodation seat as shown in FIG. 8. FIG. 10 is a schematic structural view illustrating the metal cover plate rotated from the first position to the second position when the power module is moved relative to the accommodation seat as shown in FIG. 8. FIG. 11 is a top view of FIG. 10. In the embodiment, when the rear end 402 of the power module 40 passes through and moved relative to the opening 31, the operation portions 343 of the at least two elastic latches 34a, 34b are abutted against the lateral wall 44 of the power module 40 synchronously to drive the hooks 341 to move, so that the hooks 341 of the at least two elastic latches 34a, 34b are separated away from the path of the metal cover plate 50 rotating from the first position to the second position, as shown in FIG. 10 and FIG. 11. It facilitates the power module 40 to keep pushing against the metal cover plate 50, so that the metal cover plate 50 is rotated to the second position. As the rear end 402 of the power module 40 passes through the opening 31 and pushes against the metal cover plate 50, the second connection element 41 disposed on the rear end 402 of the power module 40 and the first connection element 35 of the accommodation seat 30 are engaged with each other to form an electrical connection. In that, the metal cover plate 50 is rotated from the first position (refer to FIG. 6 and FIG. 7) to the second position (refer to FIG. 14 and FIG. 15).

Figure 12:
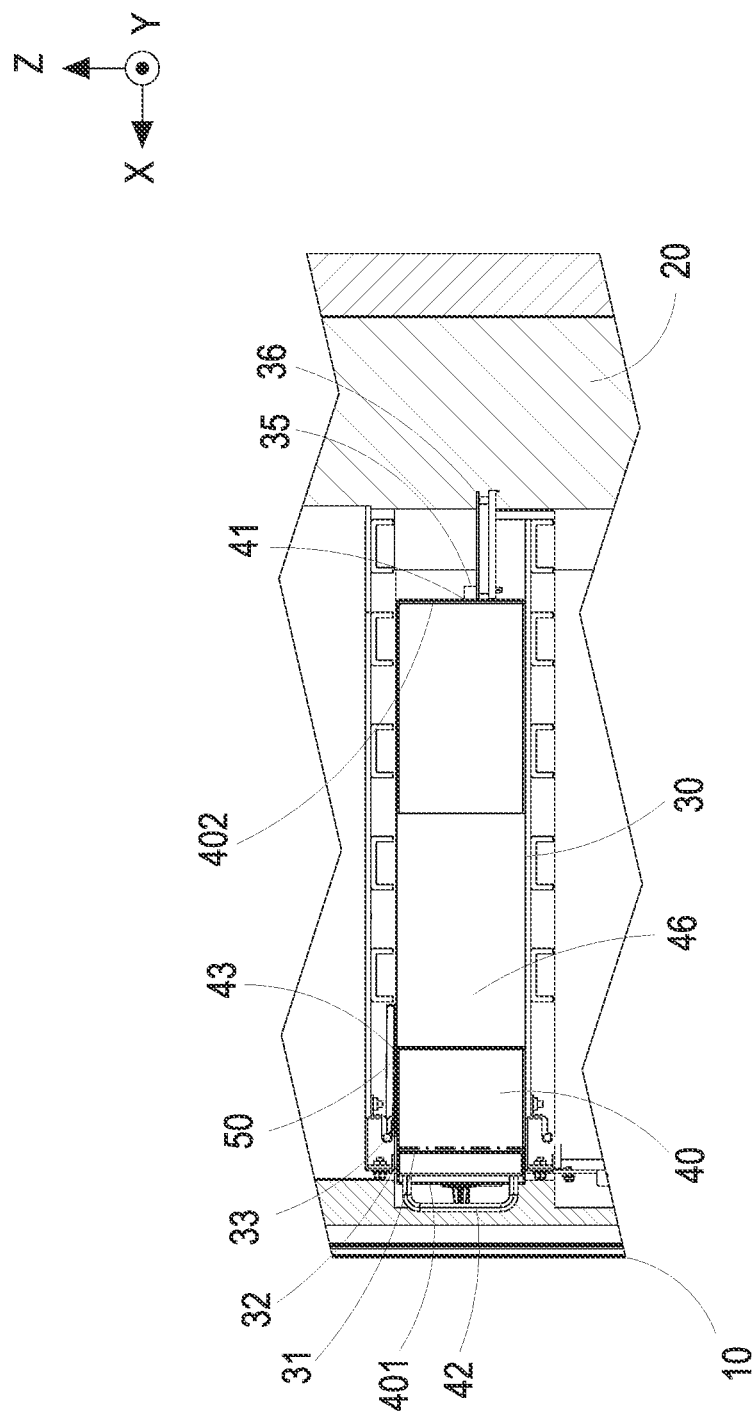
FIG. 12 is a schematic cross-sectional view illustrating the safety device of the medium-high voltage system with the power module set in the accommodation seat according to the embodiment of the present disclosure.
Figure 13:
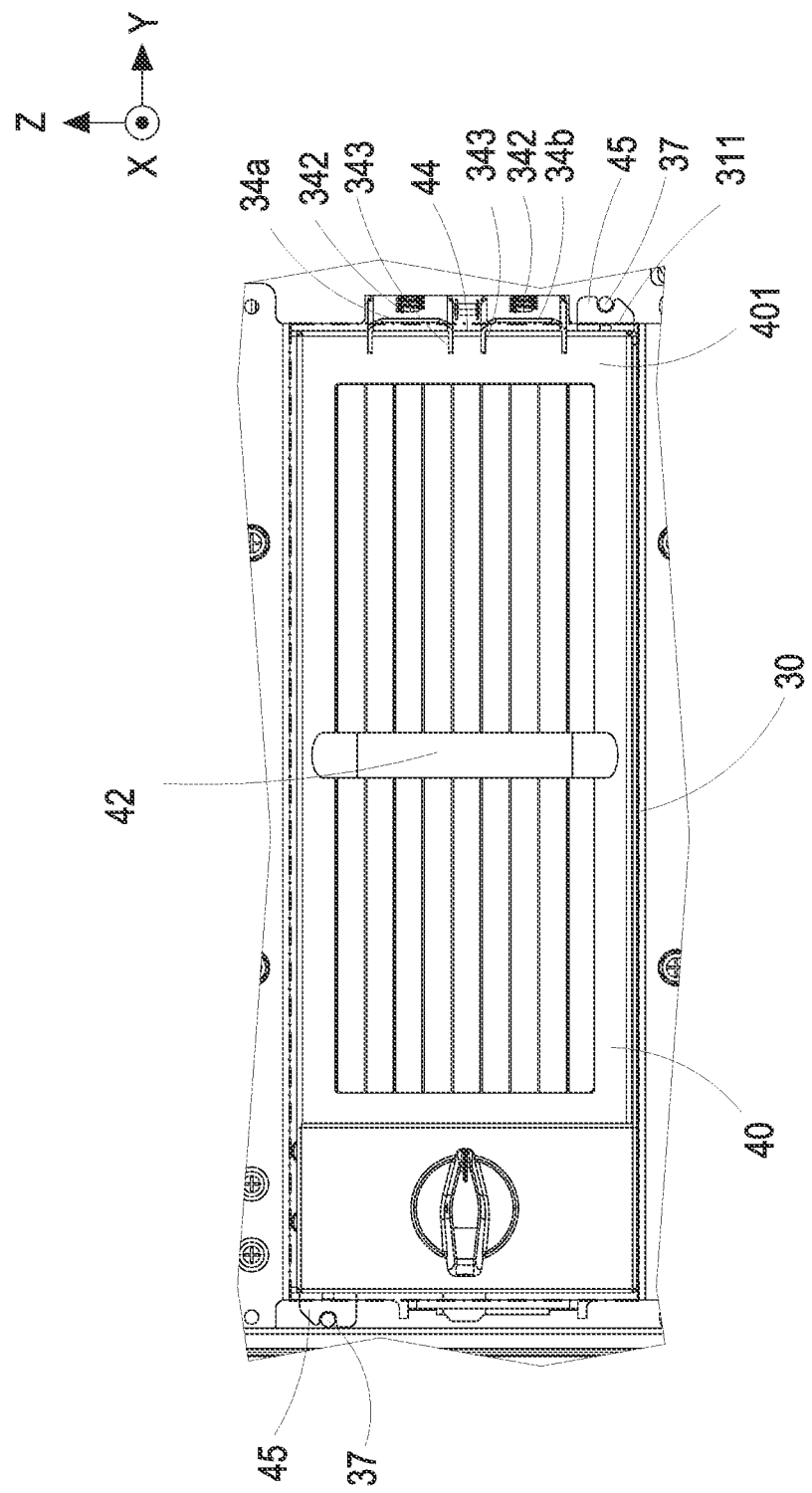
FIG. 13 is a front view illustrating the power module and the accommodation seat when the power module is set in the accommodation seat as shown in FIG. 12.
Figure 14:
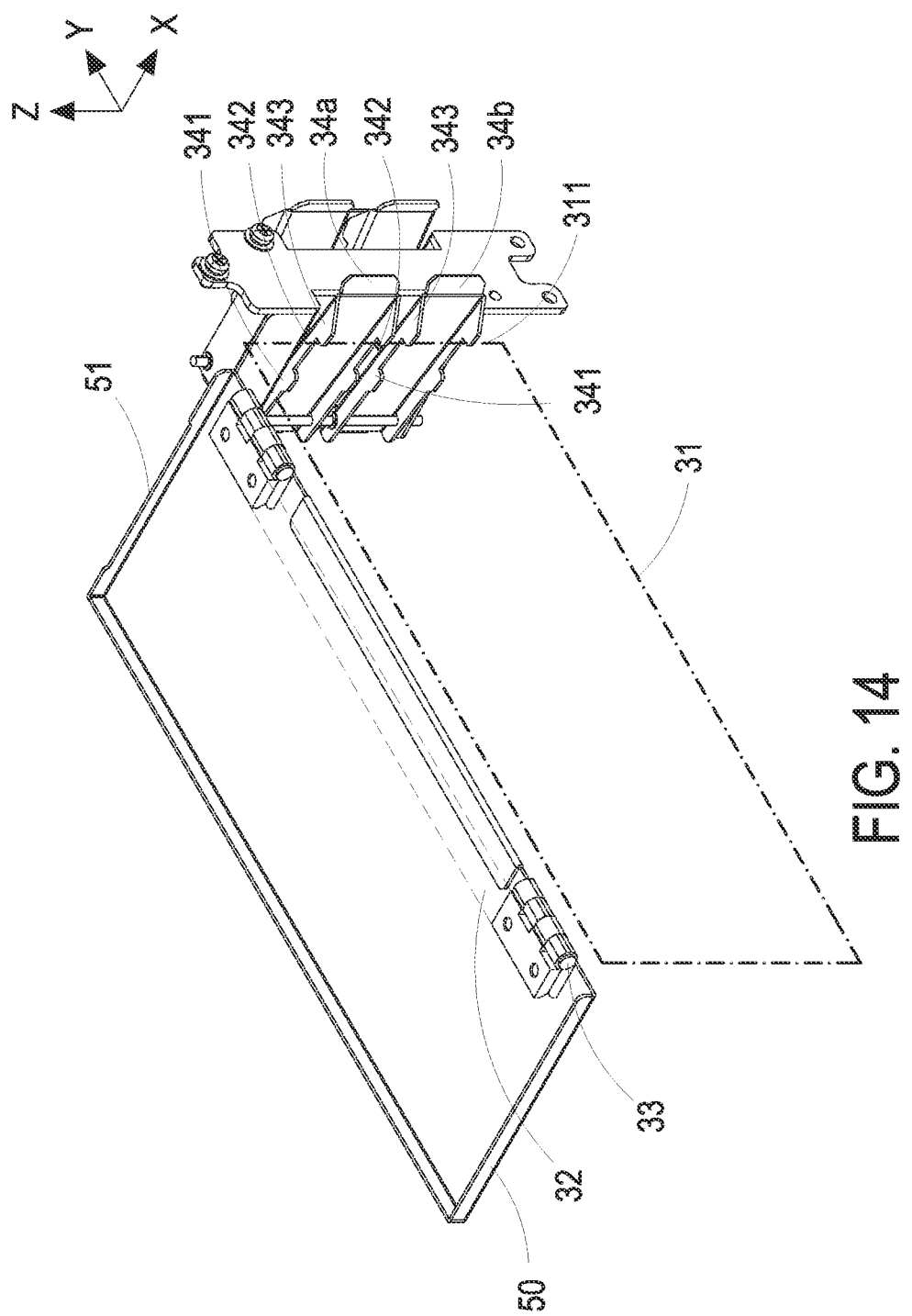
FIG. 14 is a schematic structural view illustrating the metal cover plate rotated from the first position to the second position when the power module is set in the accommodation seat as shown in FIG. 12.
Figure 15:
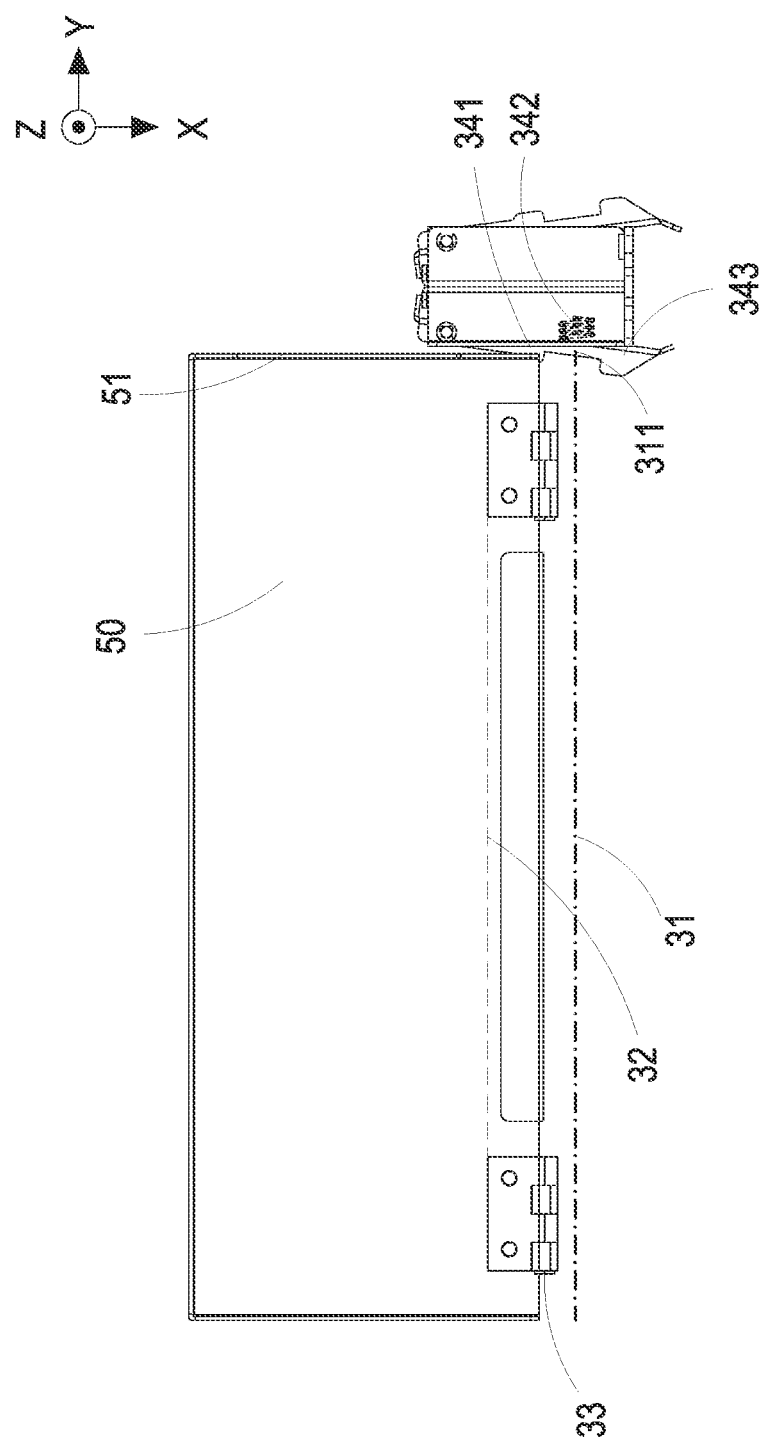
FIG. 15 is a top view of FIG. 14.

FIG. 12 is a schematic cross-sectional view illustrating the safety device of the medium-high voltage system with the power module set in the accommodation seat according to the embodiment of the present disclosure. FIG. 13 is a front view illustrating the power module and the accommodation seat when the power module is set in the accommodation seat as shown in FIG. 12. FIG. 14 is a schematic structural view illustrating the metal cover plate rotated from the first position to the second position when the power module is set in the accommodation seat as shown in FIG. 12. FIG. 15 is a top view of FIG. 14. In the embodiment, when the second connection element 41 disposed on the rear end 402 of the power module 40 and the first connection element 35 of the accommodation seat 30 are engaged with each other, the electrical connection between the power module 40 and the medium-voltage charged region 20 is achieved, and the metal cover plate 50 is rotated to the second position as shown in FIG. 14 and FIG. 15. In the embodiment, after the power module 40 is placed into the accommodation space 300 through the opening 31 and set in the accommodation seat 30, the operation portions 343 of the at least two elastic latches 34a, 34b are engaged with the front end 401 of the power module 40 to prevent the power module 40 from being detached from accommodation seat 30. Moreover, in the embodiment, after the power module 40 is placed into the accommodation space 300 through the opening 31 and set in the accommodation seat 30, the at least one fixed portion 45 of the power module 40 and the at least one fixing hole 37 of the cabinet 10 are engaged with each other through the fastening element 451, so that the power module 40 is fastened in the cabinet 10. Certainly, the method of fastening the power module 40 in the cabinet 10 is adjustable according to the practical requirements, and the present disclosure is not limited thereto. On the other hand, when the user would like to detach the power module 40 from the accommodation seat 30, the at least two elastic latches 34a, 34b have to be forced synchronously, so that the operation portions 343 of the at least two elastic latches 34a, 34b are forced and moved away from the opening 31 and disengaged with the front end 401 of the power module 40. In that, the power module 40 is allowed to be detached from the accommodation seat 30 through the opening 31. At this time, the operator is allowed to pull the power module 40 out of the accommodation seat 30 through the handle 42.

In the embodiment, when the operator pulls the power module 40 through the handle 42 to gradually separate the power module 40 from the accommodation seat 30, the metal cover plate 50 is gradually rotated from the second position (as shown in FIG. 14 and FIG. 15) to the first position (as shown in FIG. 6 and FIG. 7). When the power module 40 is completely separated from the opening 31, the metal cover plate 50 is rotated to the first position, and the operation portions 343 of the at least two elastic latches 34a, 34b are no longer pushed by the power module 40. In that, the hooks 341 of the at least two elastic latches 34a, 34b are moved back to protrude toward the opening 31, and the metal cover plate 50 is limited at the first position by the at least two elastic latches 34a, 34b, so as to prevent the metal cover plate 50 or the opening 31 from being opened by accidental touch of human. In other words, the safety device 1 is grounded by the metal cover plate 50 pivotally connected to the cabinet 10. When the power module 40 is plugged in and pulled out the accommodation seat 30, the grounded metal cover plate 50 is operated correspondingly to open and close, so as to be served as a safety shielding between the maintenance personnel and the medium-voltage charged region 20. Whereby, the maintenance procedures of the power module 40 in the safety device 1 are simplified. Moreover, when the power module 40 is pulled out of the cabinet 10, the medium-voltage charged region 20 is isolated from the maintenance personnel by the grounded metal cover plate 50 automatically, so as to ensure the safety of maintenance personnel and enhance the competitiveness of the product effectively.

In summary, the present disclosure provides a safety device of a medium-high voltage system with a power module for simplifying the maintenance procedures of the power module in the medium-high voltage system and ensuring the safety, whereby the user is capable of maintaining the power module without powering off the medium-high voltage system. Thus, the performance and the quality of the maintenance procedures are improved effectively. A metal cover plate is pivotally connected to the system cabinet and grounded, so as to replace the role of the outer case in the system cabinet. When the power module is plugged in and pulled out, the grounded metal cover plate is operated correspondingly, so as to be served as a safety shielding between the maintenance personnel and the medium-high voltage charged body. Whereby, the maintenance procedures of the power module in medium-high voltage systems are simplified. When the power module is pulled out of the system cabinet of the medium-high voltage system, the medium-high voltage charged region is isolated from the maintenance personnel by the grounded metal cover plate automatically, so as to ensure the safety. The metal cover plate rotated between a first position and a second position is further cooperated with at least two elastic latches. When the power module is detached, the metal cover plate is limited at the first position by the at least two elastic latches, so as to prevent the metal cover plate from being rotated or prevent the opening from being opened by accidental touch of human. Furthermore, when the power module is placed in the accommodation seat, the at least two elastic latches are engaged with the power module to prevent the power module from being detached and separated. On the other hand, for detaching the power module, the at least two elastic latches have to be forced synchronously, to release the power module, so that the power module is allowed to be detached from the accommodation seat. Thus, the maintenance safety of the power module is further ensured, and the competitiveness of the product is enhanced effectively.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A safety device of a medium-high voltage system, comprising:
    a cabinet comprising an accommodation seat, wherein the accommodation seat forms an accommodation space and is connected to a medium-voltage charged region, and the accommodation seat has an opening;
    a power module spatially corresponding to the accommodation seat, wherein the power module is allowed to pass through the opening and detachably disposed in the accommodation seat, so as to be electrically connected to the medium-voltage charged region;
    a metal cover plate pivotally connected to an upper edge of the accommodation seat and grounded, wherein when the metal cover plate is in a first position, the opening is closed and the medium-voltage charged region is shield, wherein the power module is allowed to pass through the opening to push the metal cover plate, so that the metal cover plate is pivotally rotated to a second position and abutted against a top surface of the power module, wherein when the power module is placed into the accommodation space and set in the accommodation seat, the power module is in an electrical connection with the medium-voltage charged region, wherein when the power module is detached from the accommodation seat, the metal cover plate is rotated to the first position, so that the opening is closed to shield the medium-voltage charged region; and
    at least two elastic latches spatially corresponding to the metal cover plate, disposed adjacent to the opening, wherein each of the at least two elastic latches comprises an elastic element located between a hook and an operation portion, so that when metal cover plate is rotated to the first position, the hook prevents the metal cover plate from rotating to the second position, wherein after the power module is placed into the accommodation space through the opening, the operation portions are engaged with a front end of the power module to prevent the power module from being detached from accommodation seat.

2. The safety device of the medium-high voltage system according to claim 1, wherein the at least two elastic latches are arranged along a lateral edge of the opening and spatially corresponding to a lateral side of the metal cover plate.

3. The safety device of the medium-high voltage system according to claim 2, wherein the at least two elastic latches are disposed separately from each other.

4. The safety device of the medium-high voltage system according to claim 1, wherein the elastic element constantly abuts against the hook.

5. The safety device of the medium-high voltage system according to claim 4, wherein each of the elastic latches further comprises an operation portion connected to the hook and the elastic element, and constantly pressed by the elastic element to protrude toward the opening, wherein when the operation portion is forced to drive the hook to abut against the elastic element, the hook is separated away from a path of the metal cover plate rotating from the first position to the second position.

6. The safety device of the medium-high voltage system according to claim 5, wherein when the power module is placed into the accommodation space through the opening and set in the accommodation seat, the operation portions of the at least two elastic latches are driven by the power module, and the hooks of the at least two elastic latches are separated away from the path of the metal cover plate rotating from the first position to the second position, so that the power module pushes against the metal cover plate to rotate to the second position.

7. The safety device of the medium-high voltage system according to claim 5, wherein after the power module is placed into the accommodation space through the opening and set in the accommodation seat, the operation portions of the at least two elastic latches are engaged with a front end of the power module to prevent the power module from being detached from accommodation seat.

8. The safety device of the medium-high voltage system according to claim 5, wherein when the operation portions of the at least two elastic latches are forced simultaneously to move away from the opening and the at least two elastic latches are disengaged with the front end of the power module, the power module is allowed to be detached from the accommodation seat through the opening.

9. The safety device of the medium-high voltage system according to claim 1, wherein the accommodation seat comprises a first connection element disposed between the accommodation seat and the medium-voltage charged region, and the power module comprises a second connection element disposed at a rear end of the power module, wherein when the power module is placed into the accommodation space and set in the accommodation seat, the first connection element is engaged with the second connection element, and the power module and the medium-voltage charged region are electrically connected to each other.

10. The safety device of the medium-high voltage system according to claim 9, wherein the power module comprises a handle disposed at a front end of the power module, wherein when the power module is placed into the accommodation space and set in the accommodation seat, the handle is exposed to the opening.

11. The safety device of the medium-high voltage system according to claim 10, wherein when the handle is forced to detach the power module from the accommodation seat, the first connection element is separated from the second connection element, and an electrical connection between the power module and the medium-voltage charged region is disconnected.

12. The safety device of the medium-high voltage system according to claim 9, wherein the first connection element and the second connection element are a male connector and a female connector, respectively, wherein the first connection element is disposed on a circuit board and protruded from an outer edge of the circuit board, wherein when the rear end of the power module is attached to the outer edge of the circuit board, the first connection element and the second connection element are engaged with each other to form an electrical connection.

13. The safety device of the medium-high voltage system according to claim 1, wherein the cabinet comprises at least one fixing hole disposed adjacent to the opening of the accommodation seat, wherein the power module comprises at least one fixed portion spatially corresponding to the at least one fixing hole, wherein after the power module is placed into the accommodation space through the opening and set in the accommodation seat, the at least one fixed portion and the at least one fixing hole are engaged with each other through a fastening element, and the power module is fastened in the cabinet.

14. The safety device of the medium-high voltage system according to claim 13, wherein the at least one fixed portion comprises two fixed portions disposed at two diagonally opposite corners of the front end of the power module, respectively, and the fastening element is a screw.

15. The safety device of the medium-high voltage system according to claim 1, wherein the metal cover plate is pivotally connected to the upper edge of the accommodation seat through a pivoting element.

16. The safety device of the medium-high voltage system according to claim 15, wherein the pivoting element is a hinge.

17. The safety device of the medium-high voltage system according to claim 1, wherein the power module further comprises an insulation section disposed between a front end of the power module and a rear end of the power module.

18. The safety device of the medium-high voltage system according to claim 1, wherein the cabinet is grounded, the medium-voltage charged region is accommodated within the cabinet, and the medium-voltage charged region is insulated from the cabinet.

19. The safety device of the medium-high voltage system according to claim 1, further comprising a control module disposed in the cabinet, electrically connected to the medium-voltage charged region and the power module, and configured to form a solid-state transformer.

* * * * *